(12) United States Patent
Wu et al.

(10) Patent No.: US 10,317,588 B2
(45) Date of Patent: Jun. 11, 2019

(54) COLOR CONVERSION FILM, DISPLAY PANEL USING COLOR CONVERSION FILM AND METHOD FOR MANUFACTURING COLOR CONVERSION FILM

(71) Applicant: HON HAI PRECISION INDUSTRY CO., LTD., New Taipei (TW)

(72) Inventors: I-Wei Wu, New Taipei (TW); Jung-An Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 82 days.

(21) Appl. No.: 15/704,061

(22) Filed: Sep. 14, 2017

(65) Prior Publication Data

US 2018/0003870 A1 Jan. 4, 2018

Related U.S. Application Data

(62) Division of application No. 14/569,120, filed on Dec. 12, 2014, now Pat. No. 9,791,605.

(30) Foreign Application Priority Data

Sep. 30, 2014 (TW) .............................. 103134107 A

(51) Int. Cl.
*G02B 5/20* (2006.01)
*G02B 5/22* (2006.01)
*B82Y 20/00* (2011.01)
*H01L 27/32* (2006.01)

(52) U.S. Cl.
CPC ............... *G02B 5/201* (2013.01); *G02B 5/22* (2013.01); *B82Y 20/00* (2013.01); *H01L 27/322* (2013.01); *Y10S 977/774* (2013.01)

(58) Field of Classification Search
CPC ......... G02F 1/133514; G02F 1/133516; G02F 1/133617; H01L 27/322; H01L 27/3211; G02B 5/201; G02B 5/206; G02B 5/22; G02B 5/223; Y10S 977/774; B82Y 20/00
USPC ................ 359/891, 892; 345/32; 349/79–80, 349/106–109; 348/273
See application file for complete search history.

(56) References Cited

U.S. PATENT DOCUMENTS

2014/0192294 A1* 7/2014 Chen ......................... F21V 9/08
349/69
2014/0204319 A1* 7/2014 Cai .................... G02F 1/133514
349/106

* cited by examiner

*Primary Examiner* — Marin Pichler
(74) *Attorney, Agent, or Firm* — ScienBiziP, P.C.

(57) ABSTRACT

A method of manufacturing a color conversion film includes: providing a substrate having a first surface and a second surface; forming a plurality of first indentations on the first surface and forming a plurality of second indentations on the second surface; forming a plurality of first quantum dot blocks in the first indentations; and forming a plurality of second quantum dot blocks in the second indentations.

10 Claims, 24 Drawing Sheets

US 10,317,588 B2

COLOR CONVERSION FILM, DISPLAY PANEL USING COLOR CONVERSION FILM AND METHOD FOR MANUFACTURING COLOR CONVERSION FILM

CROSS-REFERENCE TO RELATED APPLICATIONS

This application is a divisional application of U.S. Ser. No. 14/569,120, filed Dec. 12, 2014 the contents of which are hereby incorporated by reference. The patent application Ser. No. 14/569,120 in turn claims the benefit of priority under 35 USC 119 from Taiwanese Patent Application No. 103134107, filed on Sep. 30, 2014.

FIELD

The disclosure generally relates to display technologies, and particularly to a color conversion film, a display panel using the color conversion film, and a method for manufacturing the same.

BACKGROUND

A display panel usually employs a color filter to convert a backlight to lights with three-primary colors. However, the color filter only lets a light with a specific color through and absorbs the light with the other colors. Thus, a light transmittance of the color filter is low and a lot of backlight is wasted after passing through the color filter.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
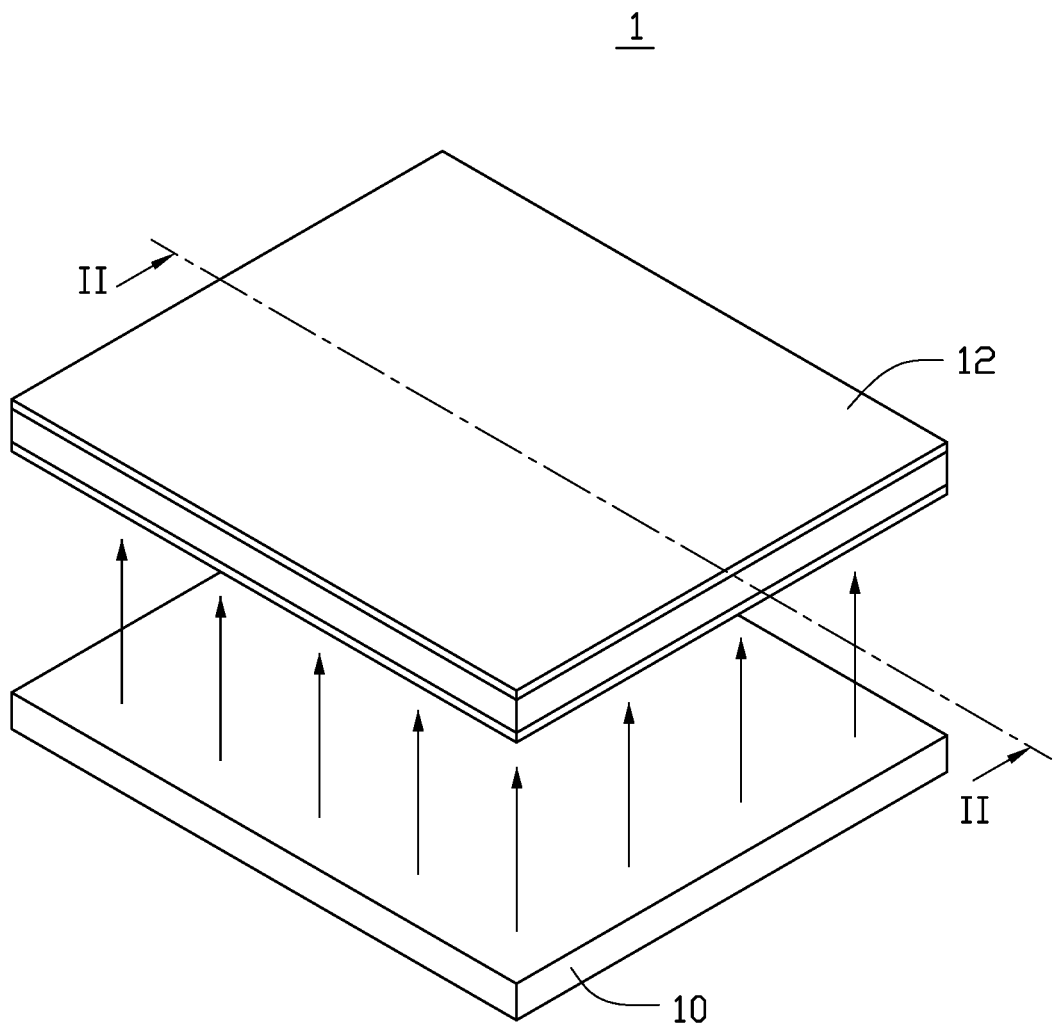
FIG. 1 is an isometric view of a first embodiment of a display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 2:
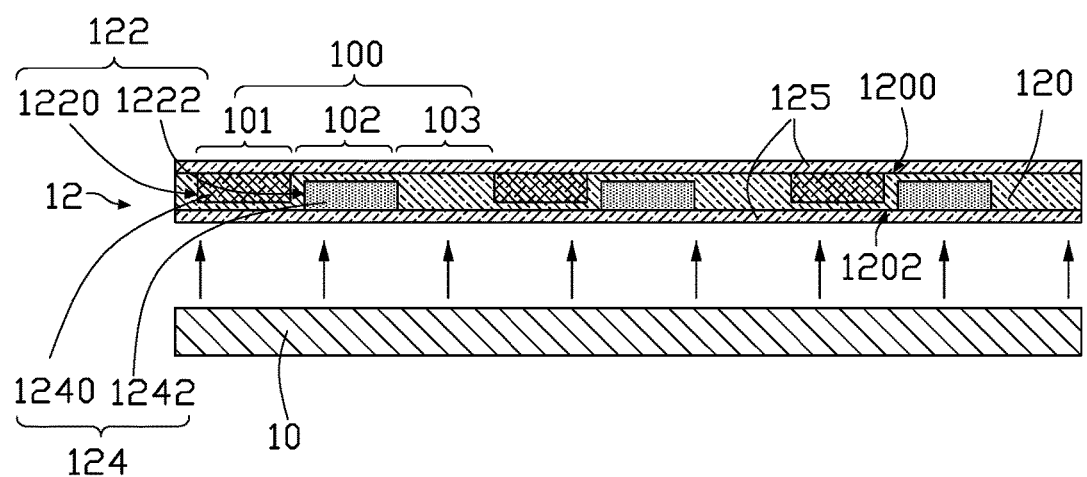
FIG. 2 is a cross-sectional view of the display panel of FIG. 1, taken along line II-II.

FIG. 1 illustrates an isometric view of a first embodiment of a display panel 1. FIG. 2 illustrates a cross-sectional view of the display panel 1 of FIG. 1, taken along line II-II. The display panel 1 defines a number of pixel areas 100. FIG. 2 shows three pixel areas 100 for example. The display panel 1 includes a backlight module 10 emitting a backlight and a color conversion film 12 set at a light output side of the backlight module 10. Each of the pixel areas 100 includes at least a first sub-pixel 101, a second sub-pixel 102, and a third sub-pixel 103 to correspondingly emit lights with three-primary colors. The color conversion film 12 defines a number of color conversion areas corresponding to the sub-pixels 101, 102, and 103 to convert the backlight to lights with three-primary colors. In this embodiment, the backlight module 10 is an organic light emitting diode (OLED) array for emitting a blue backlight.

The color conversion film 12 includes a substrate 120, a number of indentations 122 defined in the substrate 120, a number of quantum dot blocks 124 received in the indentations 122, and a number of passivation layers 125.

The substrate 120 is shaped as an elongated thin sheet and includes a first surface 1200 and a second surface 1202 parallel to the first surface 1200. The indentations 122 are respectively defined in the first surface 1200 and the second surface 1202 and extended towards an interior of the substrate 120. Positions and sizes of the indentations 122 are corresponding to the sub-pixels 101, 102, and 103. In this embodiment, the display panel 1 employs three-primary color lights to display the full color image. The first sub-pixel 101 emits a red light. The second sub-pixel 102 emits a green light. The third sub-pixel 103 emits a blue light.

The substrate 120 is made of transparent hydrophobic polymer. In this embodiment, the indentations 122 include a number of first indentations 1220 corresponding to the first sub-pixels 101 and a number of second indentations 1222 corresponding to the second sub-pixels 102. Because the backlight module 10 emits the blue light in this embodiment, the blue light emitted out of the third sub-pixel does not need to be converted to the other color light, there is no indentations 122 defined corresponding to the third sub-pixels 103 in the first surface 1200 or the second surface 1202 to accommodate the quantum dot blocks 124. In this embodiment, a thickness of the substrate 120 is no less than one micrometer and no more than one hundred and fifty micrometers.

The first indentations 1220 are defined in the first surface 1200. The second indentations 1222 are defined in the second surface 1202. The first indentations 1220 do not pass through to the second surface 1202. A first distance D1 is defined between a bottom of the first indentations 1220 and the second surface 1202. The second indentations 1222 do not pass through to the first surface 1200. A second distance D2 is defined between a bottom of the second indentations 1220 and the first surface 1200. Both the first distance D1 and the second distance D2 are no more than thirty micrometers. In this embodiment, both of the first indentations 1220 and the second indentations 1222 have a same depth defined along a direction perpendicular to the first surface 1200 and the second surface 1202 and a same width defined along a direction parallel to the first surface 1200 and the second surface 1202. The depth of the first indentations 1220 and the second indentations 1222 is no more than one hundred micrometers. The width of the first indentations 1220 and the second indentations 1222 is no less than one micrometer and no more than three hundred micrometers.

The quantum dot blocks 124 are correspondingly received in the first indentations 1220 and the second indentations 1222 to convert the backlight from the backlight module 10 to lights with three-primary colors. The quantum dot blocks 124 are formed in the first indentations 1220 and the second indentations 1222 by an ink-jet printing process, a micro-contact printing process, a screen printing process, or a micro-embossing printing process.

The quantum dot blocks 124 are made of an inorganic nano-material which can convert the backlight having a wavelength less than a wavelength of a light with a specific color to the light with the specific color. In this embodiment, the quantum dot blocks 124 includes a number of red quantum dot blocks 1240 formed in the first indentations 1220 and a number of green quantum dot blocks 1242 formed in the second indentations 1222. The red quantum dot blocks 1240 convert the blue backlight to the red light. The green quantum dot blocks 1242 convert the blue backlight to the green light. Thus, most of the blue backlight can pass through the color conversion film 12 and be used to display an image. A backlight availability of the display panel 1 is improved.

The passivation layers 125 correspondingly cover the first surface 1200 and the second surface 1202 to seal the quantum dot blocks 124 in the first indentations 1220 and the second indentations 1222. The passivation layers 125 are made of a transparent material. In this embodiment, a thickness of the passivation layer 125 is no less than one micrometer and no more than one hundred micrometers.

In this embodiment, a light output direction of the backlight module 10 is perpendicular to the first surface 1200 and the second surface 1202. One of the first surface 1200 or the second surface 1202 is used as a light incident surface of the color conversion film 12, the other one is used as a light output surface of the color conversion film 12.

Figure 3:
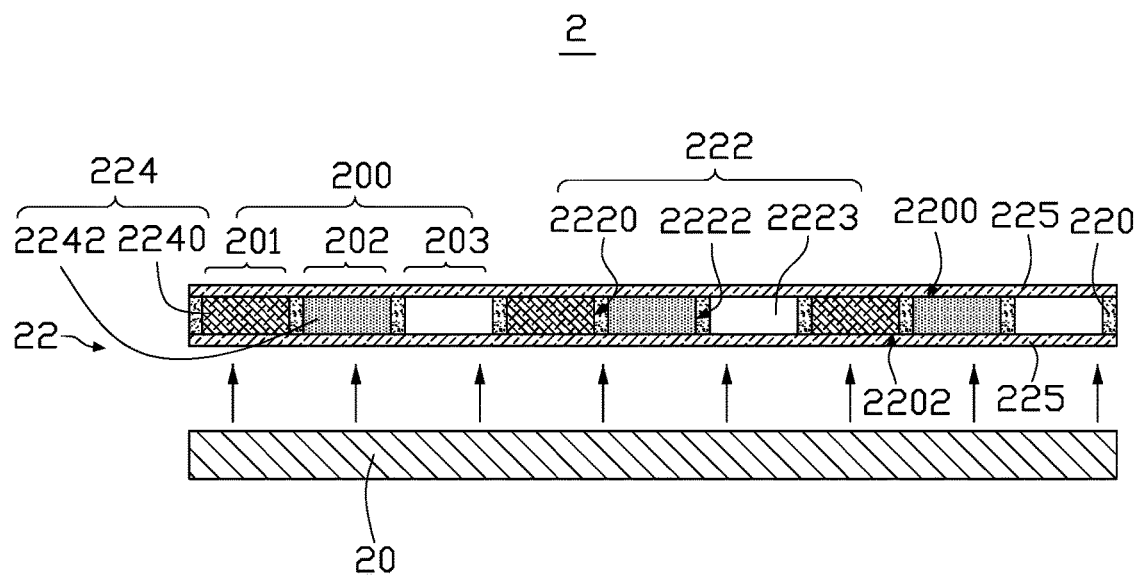
FIG. 3 is a cross-sectional view of a second embodiment of a display panel.

FIG. 3 illustrates a cross-sectional view of a second embodiment of a display panel 2. The display panel 2 defines a number of pixel areas 200. FIG. 3 shows three pixel areas 200 for example. The display panel 2 includes a backlight module 20 to emit a backlight and a color conversion film 22 set at a light output side of the backlight module 20. Each of the pixel areas 200 includes at least a first sub-pixel 201, a second sub-pixel 202, and a third sub-pixel 203 to correspondingly emit lights with three-primary colors. The color conversion film 22 defines a number of color conversion areas corresponding to the sub-pixels 201, 202, and 203 converts the backlight to lights with three-primary colors. In this embodiment, the backlight module 20 is an organic light emitting diode (OLED) array for emitting a blue backlight.

The color conversion film 22 includes a substrate 220, a number of indentations 222 defined in the substrate 220, a number of quantum dot blocks 224 received in the indentations 222, and a number of passivation layers 225.

The substrate 220 is shaped as an elongated thin sheet and includes a first surface 2200 and a second surface 2202 parallel to the first surface 2200. The indentations 222 are respectively defined in the first surface 2200 or the second surface 2202 and extended towards an interior of the substrate 220. Positions and sizes of the indentations 222 are corresponding to the sub-pixels 201, 202, and 203. In this embodiment, the display panel 2 employs three-primary color lights to display the full color image. The first sub-pixel 201 emits a red light. The second sub-pixel 202 emits a green light. The third sub-pixel 203 emits a blue light. In this embodiment, the indentations 122 have a same depth defined along a direction perpendicular to the first surface 2200 and the second surface 2202 and a width defined along a direction parallel to the first surface 2200 and the second surface 2202. The depth of the indentations 222 is no more than one hundred micrometers. The width of the indentations 222 is no less than one micrometer and no more than three hundred micrometers.

The substrate 220 is made of an opaque hydrophobic polymer. In this embodiment, the indentations 222 includes a number of first indentations 2220 corresponding to the first sub-pixels 201, a number of second indentations 2222 corresponding to the second sub-pixels 202, and a number of third indentations 2223 corresponding to the third sub-pixels 203. Each of the first indentations 2220, the second indentations 2222, and the third indentations 2223 passes through the substrate 220 from the first surface 2200 to the second surface 2202. In this embodiment, a thickness of the substrate 220 is no less than one micrometer and no more than one hundred and fifty micrometers.

The quantum dot blocks 224 are correspondingly received in the first indentations 2220 and the second indentations 2222 to convert the backlight from the backlight module 20 to lights with three-primary colors. Because the backlight module 20 emits the blue light in this embodiment, the blue light emitted out of the third sub-pixel does not need to be converted to a the other color light, there is no quantum dot blocks 224 received in the third indentations 2223. The third indentations 2223 are empty. The quantum dot blocks 224 are formed in the first indentations 2220 and the second indentations 2222 by an ink-jet printing process, a micro-contact printing process, a screen printing process, or a micro-embossing printing process.

The quantum dot blocks 224 are made of an inorganic nano-material which can convert the backlight having a wavelength less than a wavelength of a light with a specific color to light with the specific color. In this embodiment, the color conversion film 22 includes a number of red quantum dot blocks 2240 formed in the first indentations 2220 and a number of green quantum dot blocks 2242 formed in the second indentations 2222. The red quantum dot blocks 2240 convert the blue backlight to the red light. The green quantum dot blocks 2242 convert the blue backlight to green light. The blue backlight passes through the empty third indentations 2223 to emit out of the color conversion film 22. Thus, most of the blue backlight can pass through the color conversion film 22 and be used to display an image. A backlight availability of the display panel 2 is improved.

In other embodiments, if the backlight module 20 emits a light having a wavelength less than a wavelength of blue light, the quantum dot blocks 224 can be filled in the third indentations 2223 to convert the backlight to blue light.

The passivation layers 225 correspondingly cover the first surface 2200 and the second surface 2202 sealing the quantum dot blocks 224 in the first indentations 2220 and the second indentations 2222. The passivation layers 225 are made of a transparent material. In this embodiment, a thickness of the passivation layer 225 is no less than one micrometer and no more than one hundred micrometers.

Figure 4:
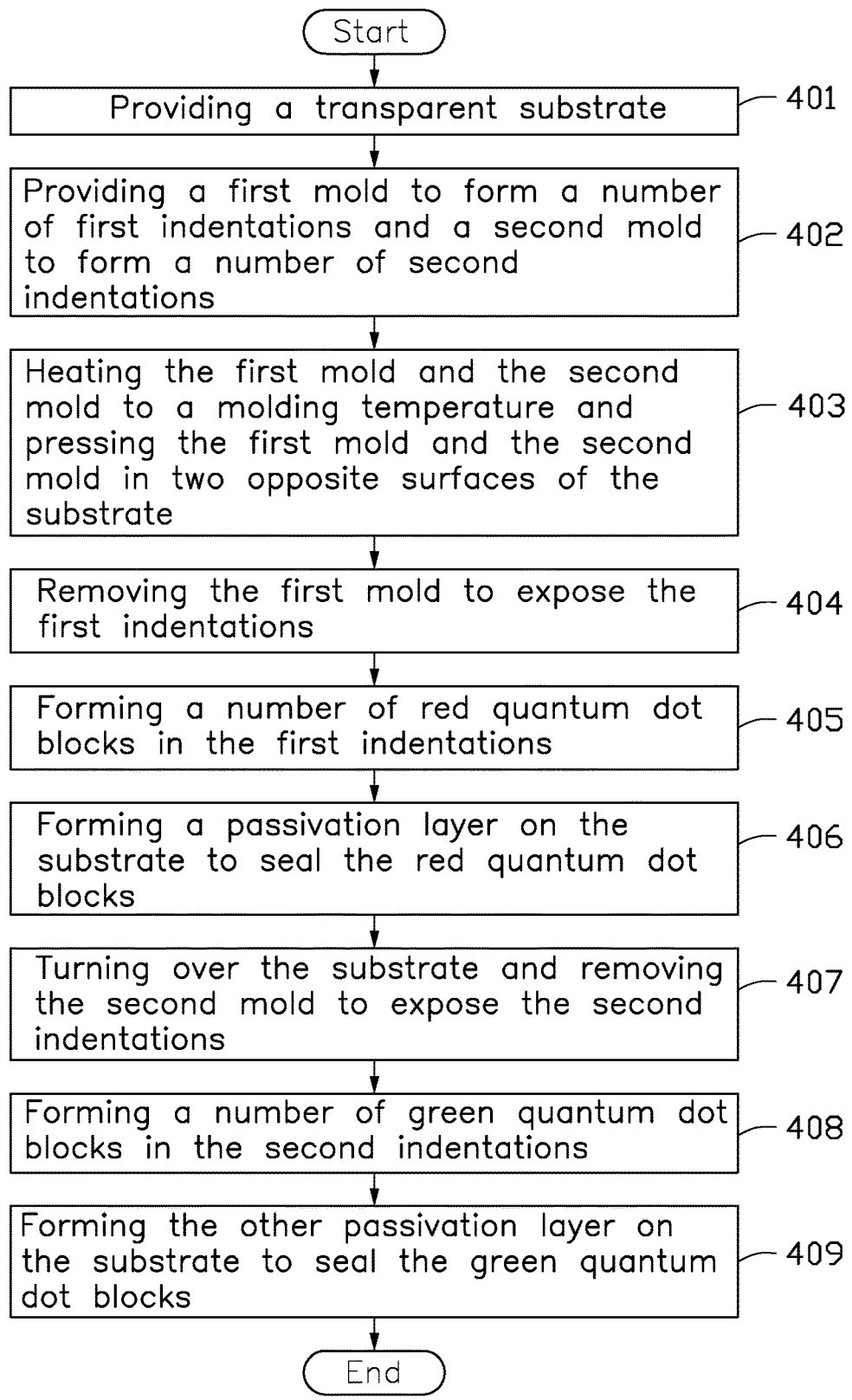
FIG. 4 is a flowchart of an exemplary embodiment of a method to manufacture the display panel of FIG. 1.

Referring to FIG. 4, a flowchart is presented in accordance with an exemplary embodiment of a method to manufacture the first embodiment of the display panel 1 is being thus illustrated. The example method is provided by way of example, as there are a variety of ways to carry out the method. The method described below can be carried out using the configurations illustrated in FIGS. 1 and 2, for example, and various elements of these figures are referenced in explaining example method. Each blocks shown in FIG. 4 represents one or more processes, methods or blocks is by example only and order of the blocks can change according to the present disclosure. The exemplary method can begin at block 401.

Figure 5:
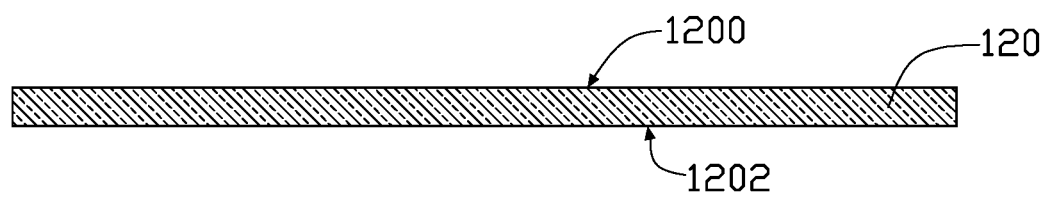
FIG. 5 is a cross-sectional view corresponding to block 401 of FIG. 4.

At block 401, also referring to FIG. 5, a substrate 120 is provided. The substrate 120 is made of transparent hydrophobic polymer. The substrate 120 is shaped as an elongated thin sheet and includes a first surface 1200 and a second surface 1202 parallel to the first surface 1200.

Figure 6:
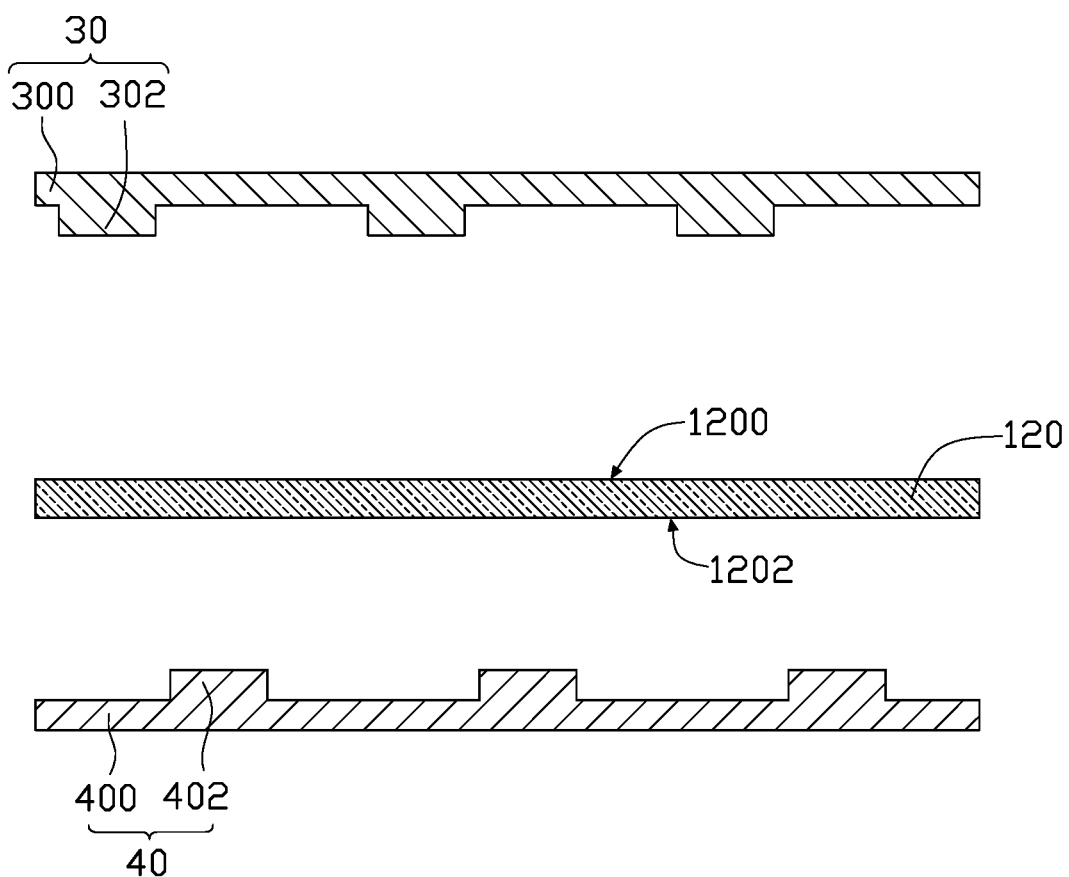
FIG. 6 is a cross-sectional view corresponding to block 402 of FIG. 4.

At block 402, also referring to FIG. 6, a first mold 30 and a second mold 40 are provided. The first mold 30 is used to form a number of first indentations 1220 on the first surface 1200. The second mold 40 is used to form a number of second indentations 1222 on the second surface 1202. The first mold 30 includes a first base board 300 and a number of first bumps 302 extending from a side surface of the first base board 300. The second mold 40 includes a second base board 400 and a number of second bumps 402 extending from a side surface of the second base board 400.

The first mold 30 is set at a side of the substrate 120 facing the first surface 1200. The first bumps 302 face the first surface 1200 and align with positions of the first indentations 1220 on the first surface 1200. The second mold 40 is set at a side of the substrate 120 facing the second surface 1202. The second bumps 402 face the second surface 1202 and align with positions of the second indentations 1222 on the second surface 1202.

Figure 7:
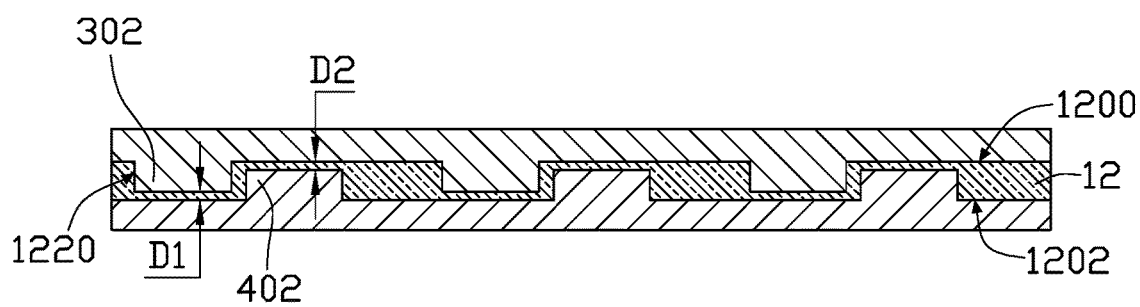
FIG. 7 is a cross-sectional view corresponding to block 403 of FIG. 4.

At block 403, also referring to FIG. 7, the first mold 30 and the second mold 40 are heated to a molding temperature and then press the substrate 120 correspondingly from the first surface 1200 and the second surface 1202 to form the first indentations 1220 in the first surface 1200 and the second indentations 1222 in the second surface 1202. The molding temperature is not less than a phase-transition temperature of the substrate 12 transforming from a solid phase to a liquid phase. Because the first indentations 1220 and the second indentations 1222 do not pass through the substrate 12 in the first embodiment of display panel 1, the first bumps 302 keep a first distance D1 away from the second surface 1202, and the second bumps 402 keep a second distance D2 away from the first surface 1200. Both of the first distance D1 and the second distance D2 are no more than thirty micrometers.

Figure 8:
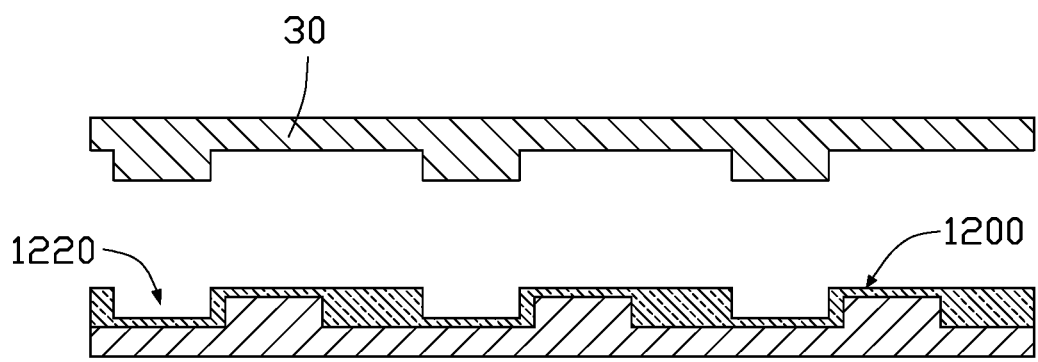
FIG. 8 is a cross-sectional view corresponding to block 404 of FIG. 4.

At block 404, also referring to FIG. 8, the first mold 30 is removed to expose the first indentations 1220 formed on the first surface 1200.

Figure 9:
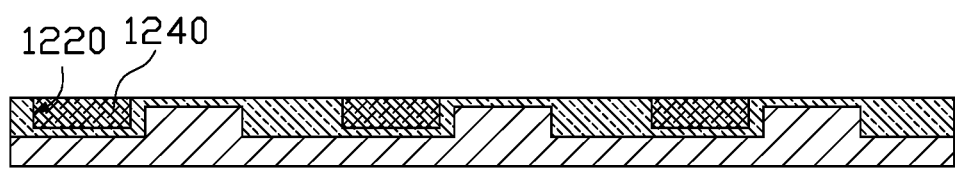
FIG. 9 is a cross-sectional view corresponding to block 405 of FIG. 4.

At block 405, also referring to FIG. 9, a number of red quantum dot blocks 1240 are formed in the first indentations 1220. The red quantum dot blocks 1240 are formed in the first indentations 1220 by an ink-jet printing process, a micro-contact printing process, a screen printing process, or a micro-embossing printing process. The red quantum dot blocks 1240 are cured after being formed in the first indentations 1220.

Figure 10:
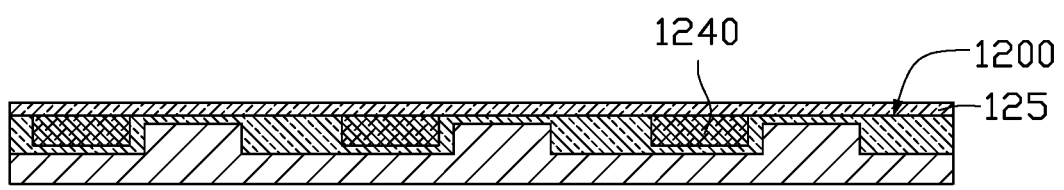
FIG. 10 is a cross-sectional view corresponding to block 406 of FIG. 4.

Also block 406, also referring to FIG. 10, a passivation layer 125 is formed on the first surface 1200 to seal the red quantum dot blocks 1240 in the first indentations 1220.

Figure 11:
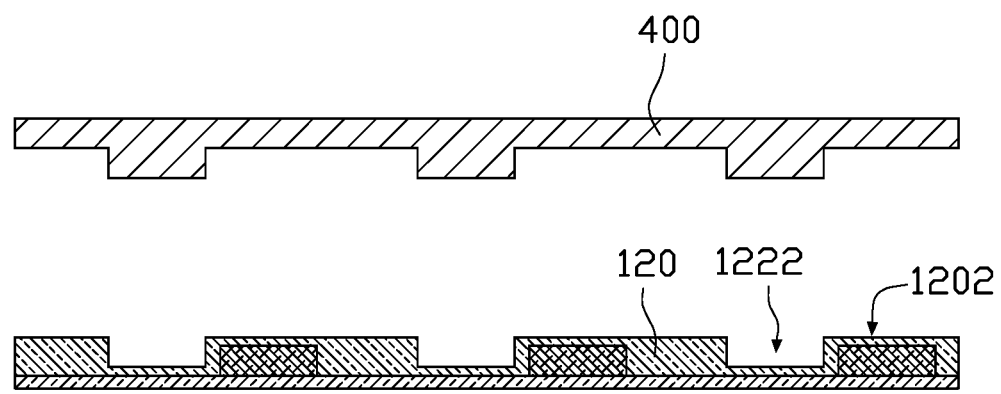
FIG. 11 is a cross-sectional view corresponding to block 407 of FIG. 4.

At block 407, also referring to FIG. 11, the substrate 120 with the second mold 40 is turned over. The second mold 40 is removed to expose the second indentations 1222 on the second surface 1202.

Figure 12:
FIG. 12 is a cross-sectional view corresponding to block 408 of FIG. 4.

At block 408, also referring to FIG. 12, a number of green quantum dot blocks 1242 are formed in the second indentations 1222. The green quantum dot blocks 1242 are formed in the second indentations 1222 by an ink-jet printing process, a micro-contact printing process, a screen printing process, or a micro-embossing printing process. The green quantum dot blocks 1242 are cured after being formed in the second indentations 1222.

Figure 13:
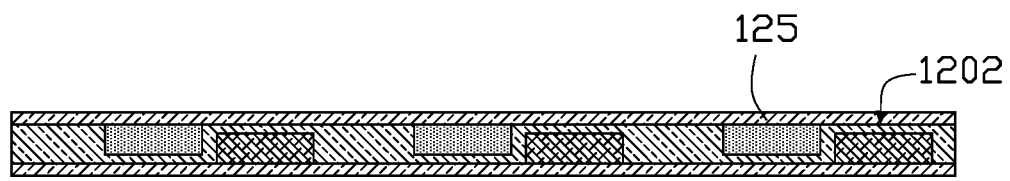
FIG. 13 is a cross-sectional view corresponding to block 409 of FIG. 4.

At block 409, also referring to FIG. 13, the other passivation layer 125 is formed on the second surface 1202 to seal the green quantum dot blocks 1242 in the second indentations 1222.

Figure 14:
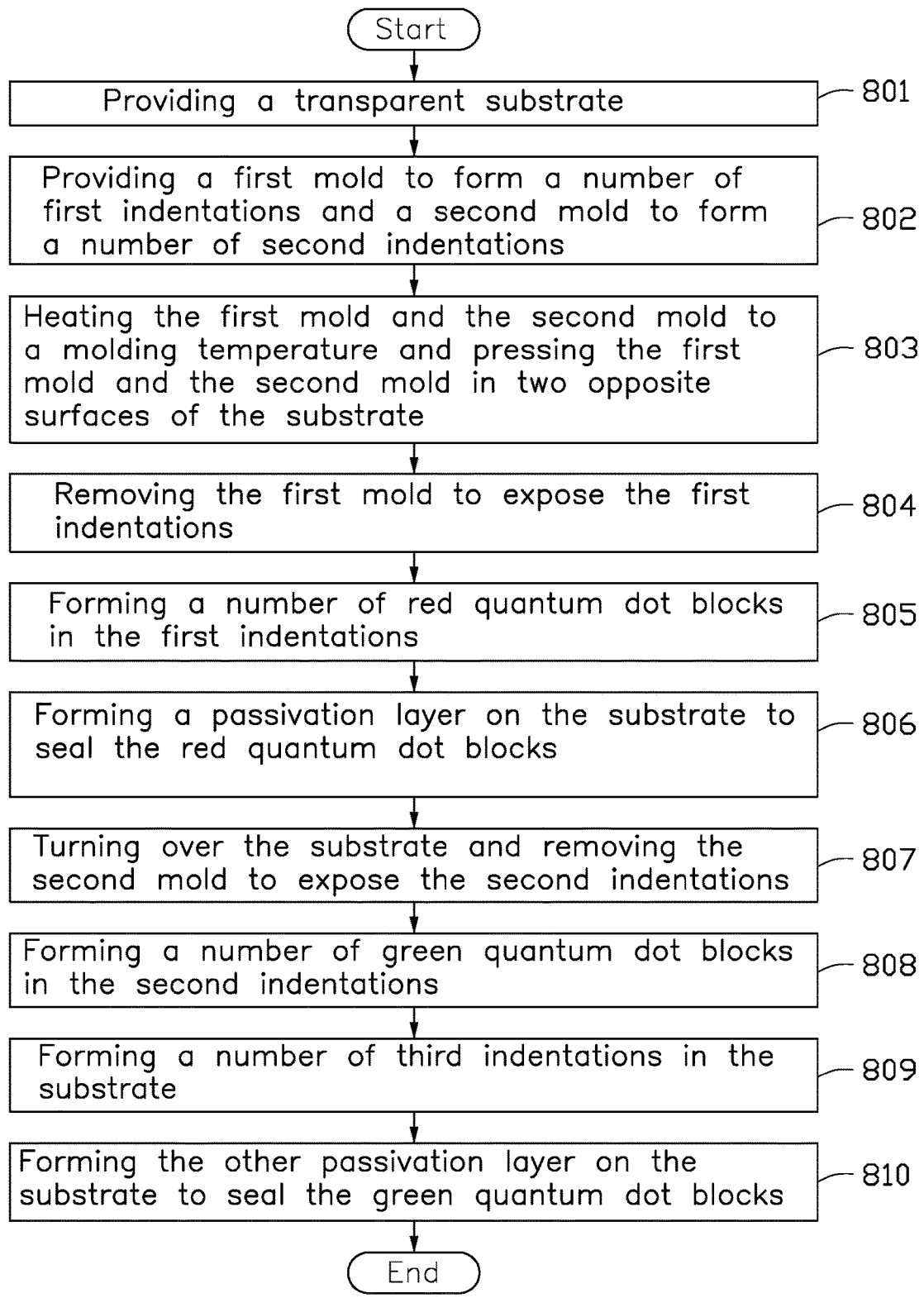
FIG. 14 is a flowchart of an exemplary embodiment of a method to manufacture the display panel of FIG. 3.

Referring to FIG. 14, a flowchart is presented in accordance with an exemplary embodiment of a method to manufacture the first embodiment of the display panel 2 is being thus illustrated. The example method is provided by way of example, as there are a variety of ways to carry out the method. The method described below can be carried out using the configurations illustrated in FIGS. 1 and 3, for example, and various elements of these figures are referenced in explaining example method. Each blocks shown in FIG. 14 represents one or more processes, methods or blocks is by example only and order of the blocks can change according to the present disclosure. The exemplary method can begin at block 801.

Figure 15:
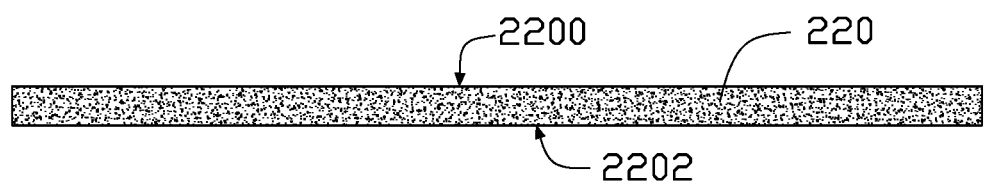
FIG. 15 is a cross-sectional view corresponding to block 801 of FIG. 10.

At block 801, also referring to FIG. 15, a substrate 220 is provided. The substrate 220 is made of opaque hydrophobic polymer. The substrate 220 is shaped as an elongated thin sheet and includes a first surface 2200 and a second surface 2202 parallel to the first surface 2200.

Figure 16:
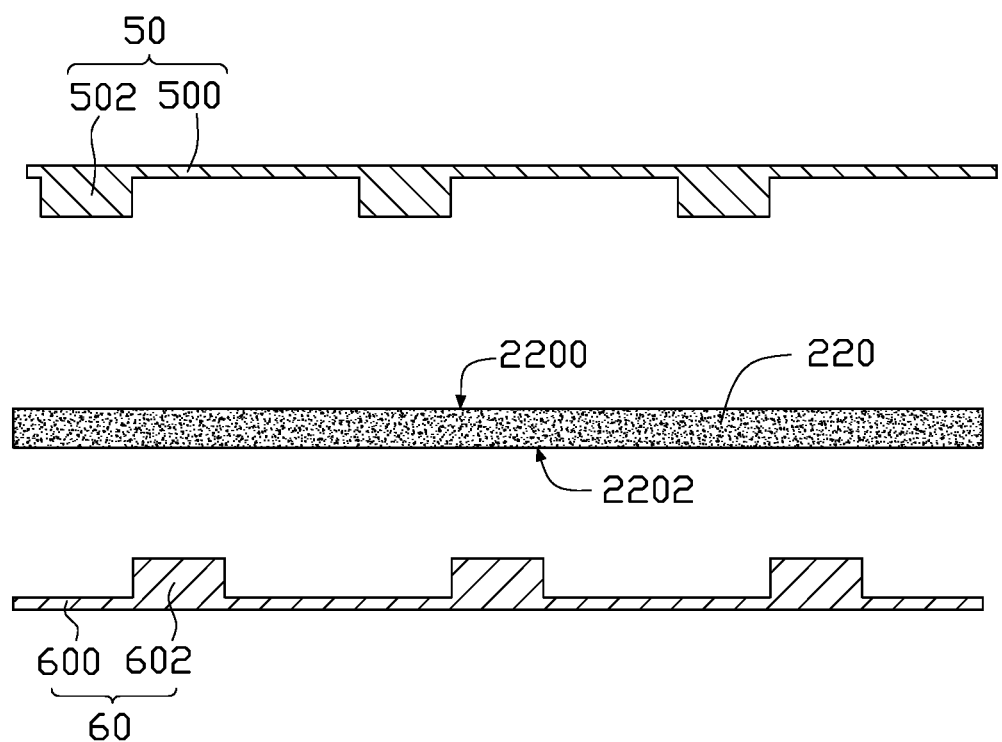
FIG. 16 is a cross-sectional view corresponding to block 802 of FIG. 10.

At block 802, also referring to FIG. 16, a first mold 50 and a second mold 60 are provided. The first mold 50 is used to form a number of first indentations 2220 on the first surface 2200. The second mold 60 is used to form a number of second indentations 2222 on the second surface 2202. The first mold 50 includes a first base board 500 and a number of first bumps 502 extending from a side surface of the first base board 500. The second mold 60 includes a second base board 600 and a number of second bumps 602 extending from a side surface of the second base board 600.

The first mold 50 is set at a side of the substrate 220 facing the first surface 2200. The first bumps 502 face the first surface 2200 and align with positions of the first indentations 2220 on the first surface 2200. The second mold 60 is set at a side of the substrate 220 facing the second surface 2202. The second bumps 602 face the second surface 2202 and align with positions of the second indentations 2222 on the second surface 2202.

Figure 17:
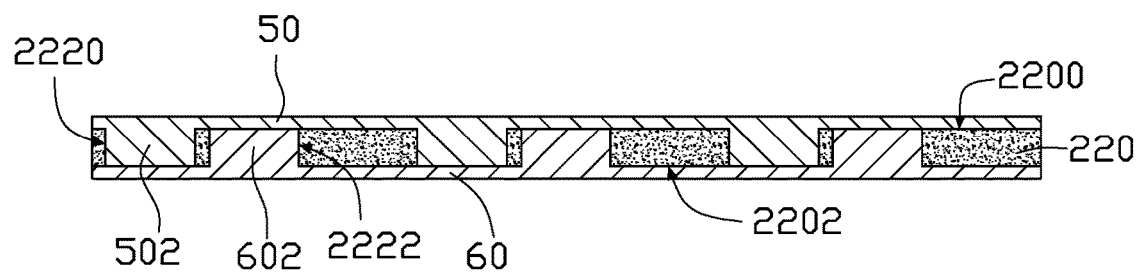
FIG. 17 is a cross-sectional view corresponding to block 803 of FIG. 10.

At block 803, also referring to FIG. 17, the first mold 50 and the second mold 60 are heated to a molding temperature and then press the substrate 220 correspondingly from the first surface 2200 and the second surface 2202 to form the first indentations 2220 in the first surface 2200 and the second indentations 2222 in the second surface 2202. The molding temperature is not less than a phase-transition temperature of the substrate 12 transforming from a solid phase to a liquid phase. Because the first indentations 2220 and the second indentations 2222 pass through the substrate 22 in the second embodiment of display panel 2, the first bumps 502 contact with the second surface 2202 after the first mold 50 is pressed to the substrate 22, and the second bumps 602 contact with the first surface 2200 after the second mold 60 is pressed to the substrate 22.

Figure 18:
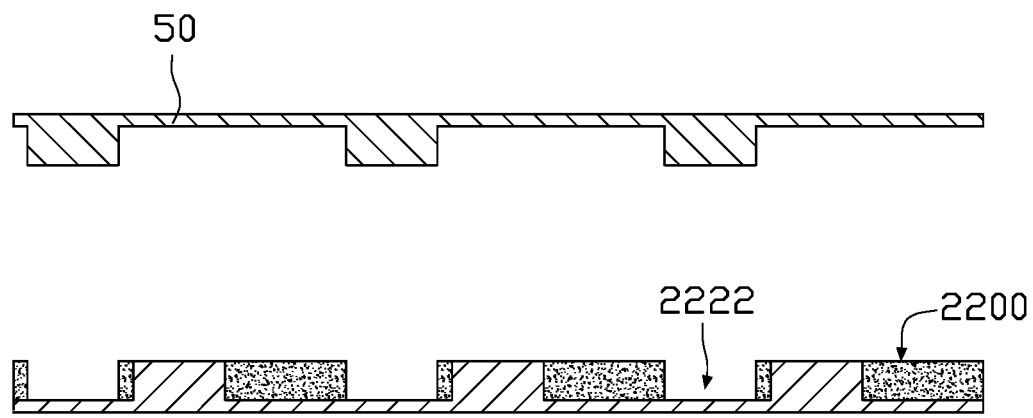
FIG. 18 is a cross-sectional view corresponding to block 804 of FIG. 10.

At block 804, also referring to FIG. 18, the first mold 50 is removed to expose the first indentations 2220 formed on the first surface 2200.

Figure 19:
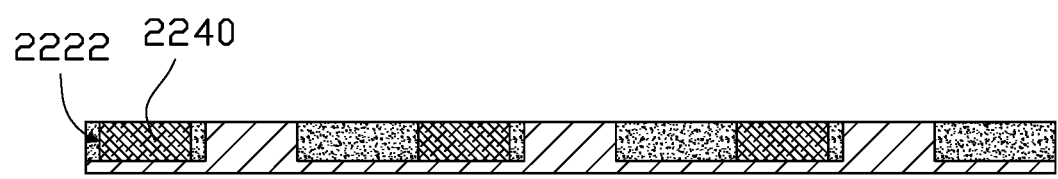
FIG. 19 is a cross-sectional view corresponding to block 805 of FIG. 10.

At block 805, also referring to FIG. 19, a number of red quantum dot blocks 2240 are formed in the first indentations 2220. The red quantum dot blocks 2240 are formed in the first indentations 2220 by an ink-jet printing process, a micro-contact printing process, a screen printing process, or a micro-embossing printing process. The red quantum dot blocks 2240 are cured after being formed in the first indentations 2220.

Figure 20:
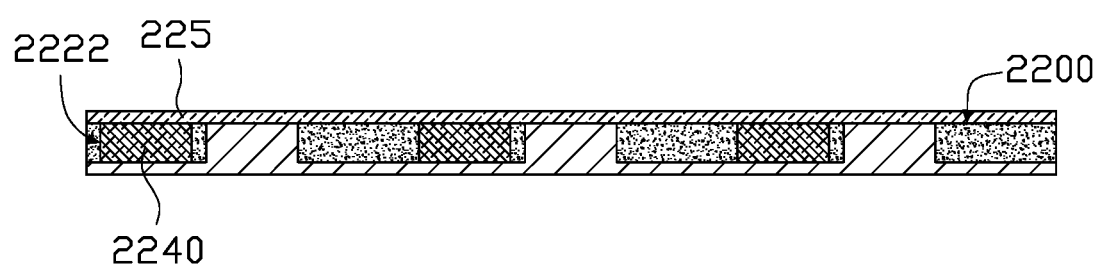
FIG. 20 is a cross-sectional view corresponding to block 806 of FIG. 10.

At block 806, also referring to FIG. 20, a passivation layer 225 is formed on the first surface 2200 to seal the red quantum dot blocks 2240 in the first indentations 2220.

Figure 21:
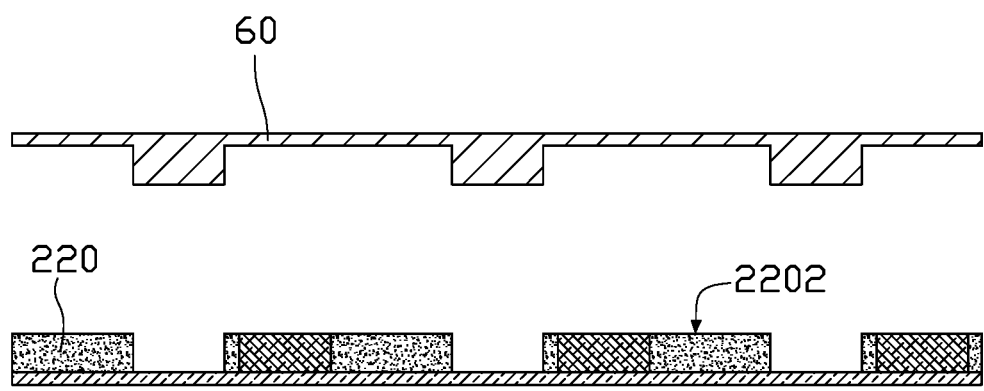
FIG. 21 is a cross-sectional view corresponding to block 807 of FIG. 10.

At block 807, also referring to FIG. 21, the substrate 220 with the second mold 60 are turned over. The second mold 60 is removed to expose the second indentations 2222 on the second surface 2202.

Figure 22:
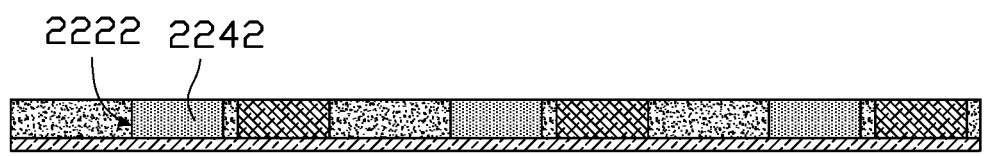
FIG. 22 is a cross-sectional view corresponding to block 808 of FIG. 10.

At block 808, also referring to FIG. 22, a number of green quantum dot blocks 2242 are formed in the second indentations 2222. The green quantum dot blocks 2242 are formed in the second indentations 2222 by an ink-jet printing process, a micro-contact printing process, a screen printing process, or a micro-embossing printing process. The green quantum dot blocks 2242 are cured after being formed in the second indentations 2222.

Figure 23:
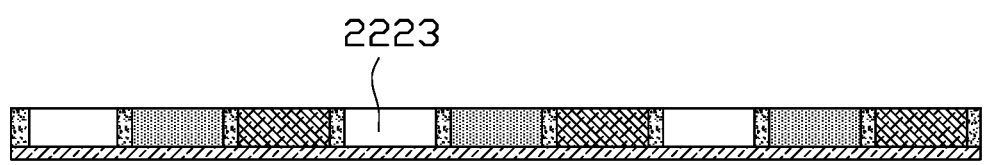
FIG. 23 is a cross-sectional view corresponding to block 809 of FIG. 10.

At block 809, also referring to FIG. 23, a number of third indentations 2223 are defined in substrate 22 corresponding to positions of the third sub-pixels 203.

Figure 24:
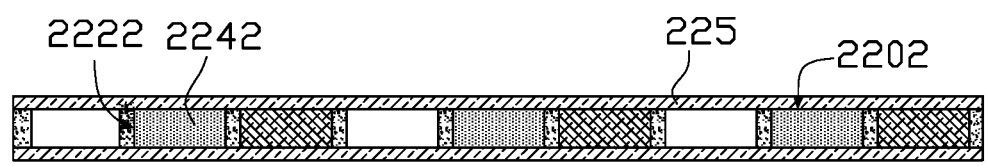
FIG. 24 is a cross-sectional view corresponding to block 810 of FIG. 10.

At block 810, also referring to FIG. 24, the other passivation layer 225 is formed on the second surface 2202 to seal the green quantum dot blocks 2242 in the second indentations 2222.

It is believed that the present embodiments and their advantages will be understood from the foregoing description, and it will be apparent that various changes may be made thereto without departing from the scope of the disclosure or sacrificing all of its material advantages.

What is claimed is:

1. A method of manufacturing a color conversion film, the color conversion film comprising:
   a plurality of first sub-pixels emitting a first primary color light, a plurality of second sub-pixels emitting a second primary color light, and a plurality of third sub-pixels emitting a third primary color light,
   the method comprising:
   providing a substrate comprising a first surface and a second surface, the first surface being an outer topmost surface of the substrate, and the second surface being an outer lowest surface of the substrate;
   forming a plurality of first indentations on the first surface and forming a plurality of second indentations on the second surface, wherein each of the plurality of first indentations does not extend through the second surface, a first distance is defined between a bottom of each of the plurality of first indentations and the second surface, each of the plurality of second indentations does not extend through the first surface, and a second distance is defined between a bottom of each of the plurality of second indentations and the first surface;
   forming a plurality of first quantum dot blocks in the first indentations to convert an incident light to a first primary color light and curing the first quantum dot blocks in the first indentations;
   forming a first passivation layer on the first surface to seal the first quantum dot blocks in the first indentations;
   forming a plurality of second quantum dot blocks in the second indentations to convert an incident light to a second primary color light and curing the second quantum dot blocks in the second indentations; and
   forming a second passivation layer on the second surface to seal the second quantum dot blocks in the second indentations.

2. The method of claim 1, wherein forming a plurality of first indentations on the first surface and forming a plurality of second indentations on the second surface comprises:
   providing a first mold and a second mold, wherein the first mold comprises a first base board and a plurality of first bumps extending from a side surface of the first base board, the second mold comprises a second base board and a plurality of second bumps extending from a side surface of the second base board;
   setting the first mold at a side of the substrate facing the first surface and setting the second mold at other side of the substrate facing the second surface;
   pressing the substrate by the first mold and the second mold correspondingly from the first surface and the second surface;
   removing the first mold to expose the plurality of first indentations formed on the first surface; and
   removing the second mold to expose the plurality of second indentations on the second surface.

3. The method of claim 2, wherein the plurality of first bumps keep the first distance away from the second surface after the first mold is pressed to the substrate, and the plurality of second bumps keep the second distance away from the first surface after the second mold is pressed to the substrate.

4. The method of claim 3, wherein both of the first distance and the second distance are no more than thirty micrometers.

5. The method of claim 2, wherein when pressing the substrate by the first mold and the second mold, the first mold and the second mold are heated to a molding temperature.

6. The method of claim 5, wherein the molding temperature is no less than a phase-transition temperature of the substrate transforming from a solid phase to a liquid phase.

7. The method of claim 1, wherein forming a plurality of first quantum dot blocks in the first indentations is carried out by an ink-jet printing process, a micro-contact printing process, a screen printing process, or a micro-embossing printing process.

8. The method of claim 1, wherein a plurality of third indentations are defined in substrate corresponding to positions of the third sub-pixels.

9. The method of claim 1, wherein the substrate is made of transparent hydrophobic polymer.

10. The method of claim 1, wherein the substrate is made of opaque hydrophobic polymer.

* * * * *